United States Patent [19]
Choi

[11] Patent Number: 5,933,463
[45] Date of Patent: Aug. 3, 1999

[54] METHOD AND CIRCUIT FOR CALCULATING METRICS FOR AN ANALOG VITERBI DETECTOR

[75] Inventor: Davy H. Choi, Garland, Tex.

[73] Assignee: Texas Instruments Incorporated, Dallas, Tex.

[21] Appl. No.: 08/759,245

[22] Filed: Dec. 2, 1996

[51] Int. Cl.$^6$ .............................. H03D 1/00; H04L 27/06
[52] U.S. Cl. .................... 375/341; 375/262; 371/43.8
[58] Field of Search ..................... 375/262, 316, 375/340, 341, 346; 371/43.7, 43.8, 43.6; 360/65, 40

[56] References Cited

U.S. PATENT DOCUMENTS

| | | | |
|---|---|---|---|
| 5,373,400 | 12/1994 | Kovacs | 360/46 |
| 5,384,560 | 1/1995 | Yamasaki | 340/146.2 |
| 5,430,768 | 7/1995 | Minuhin et al. | 375/340 |
| 5,469,462 | 11/1995 | Kahlman et al. | 375/232 |
| 5,648,949 | 7/1997 | Miyamoto et al. | 369/59 |
| 5,734,680 | 3/1998 | Moore et al. | 375/263 |
| 5,774,286 | 6/1998 | Shimoda | 360/46 |

*Primary Examiner*—Chi H. Pham
*Assistant Examiner*—Bryan Webster
*Attorney, Agent, or Firm*—W. Daniel Swayze, Jr.; Wade James Brady, III; Richard L. Donaldson

[57] ABSTRACT

A method and circuit for generating an updated metric signal for an analog Viterbi detector is disclosed. A circuit in accordance with the invention comprises a first summing amplifier 11 for subtracting a first reference voltage from a data signal; a second summing amplifier 12 for subtracting a second reference voltage from the data signal; a first comparator 21 for comparing the output of the first summing amplifier with a previous metric signal; a second comparator 22 for comparing the output of the second summing amplifier with the previous metric signal; a first AND gate 41 for combining the output of the first comparator and a first clock signal; a second AND gate 42 for combining the output of the second comparator and the first clock signal; a first sample-and-hold device 51 for sampling the output of the first summing amplifier 11 in response to the output of the first AND gate 41; and a second sample-and-hold device 52 for sampling the output of the second summing amplifier 12 in response to the output of the second AND gate 42. The updated metric signal is output on node 70. A holding capacitor 60 retains a charge associated with the updated metric signal during clock cycles when sample-and-hold circuits 51 and 52 are not triggered.

14 Claims, 2 Drawing Sheets

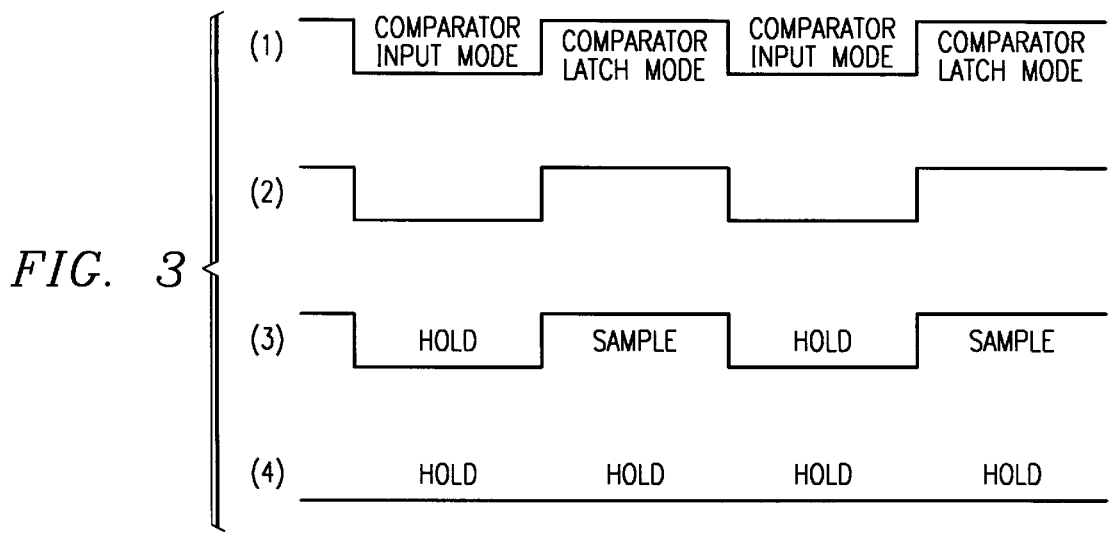
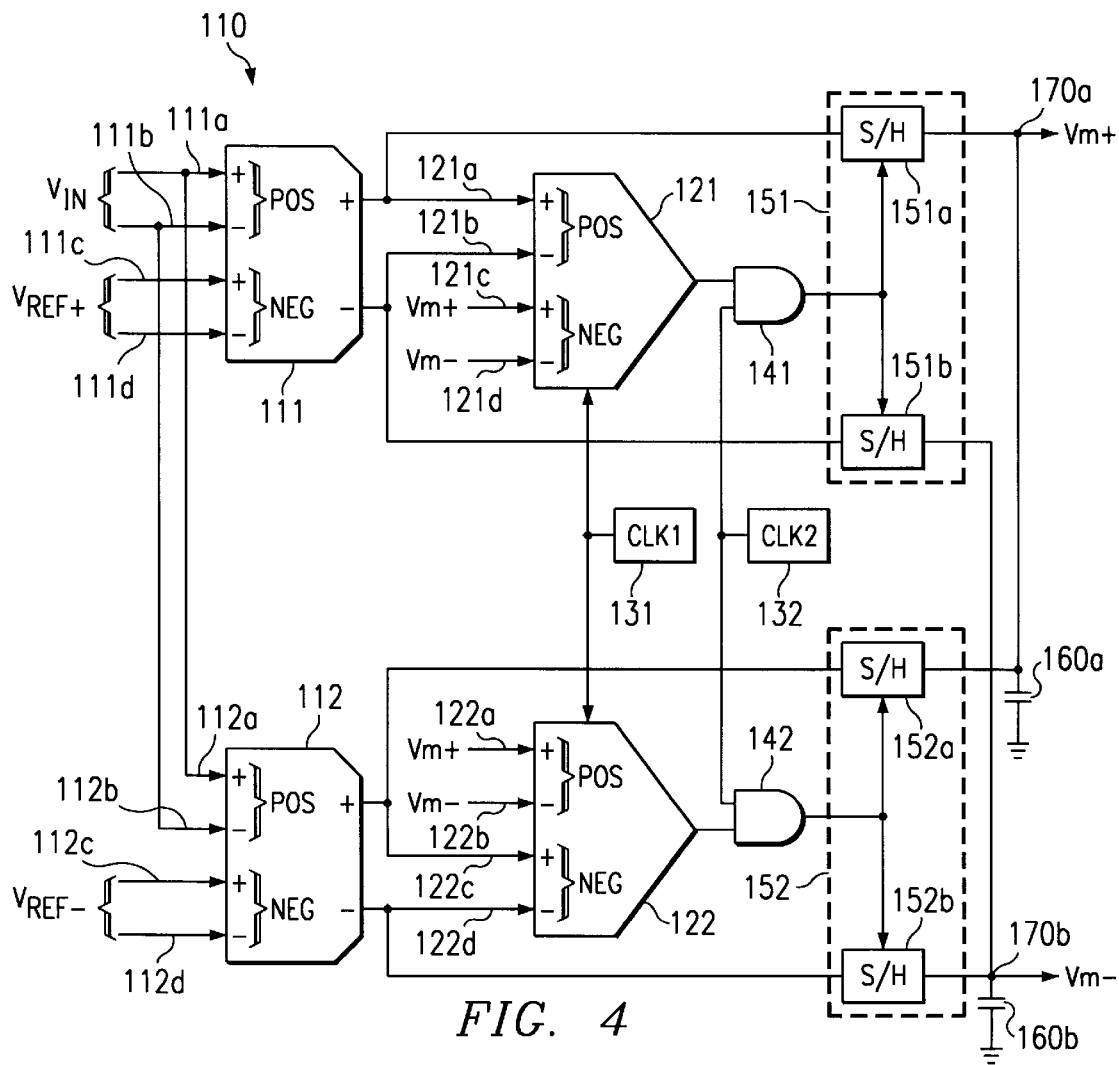

METHOD AND CIRCUIT FOR CALCULATING METRICS FOR AN ANALOG VITERBI DETECTOR

TECHNICAL FIELD OF THE INVENTION

This invention relates generally to the field of hard disk drive read channel circuits and more particularly to a method and circuit for calculating metrics for an analog Viterbi detector.

BACKGROUND OF THE INVENTION

Traditional hard disk drive (HDD) read channels use a technique known as peak detection for extracting digital information from the analog information stored on the disk's magnetic surface. In this technique, the magnitude of the waveform is sampled during a sampling window, and if the waveform level is above a certain threshold, the data is considered a "one." Otherwise, the data is considered a "zero."

Using this technique of data encoding, each "one" requires a change in the direction of magnetization (known as a flux change) on the magnetic medium of the disk. The number of flux changes which can be accommodated in a given length of a data channel is limited by the magnetic properties of the recording medium on the disk. This places an upper limit on the density of data which can be stored on the disk.

More recently, advanced encoding techniques utilizing discrete time signal processing (DTSP) have been used to improve the density of data on a hard disk. One family of codes in common use are known as Run Length Limited (RLL) codes. RLL codes encode information in the length of the "run" of zeros between each one. RLL codes therefore reduce the number of flux changes required to convey a given amount of information. By increasing the amount of data conveyed per flux change, RLL codes allow data to be stored with greater density on magnetic disks.

Since the sequence of bits written to a disk using an RLL code is not the same as the bit sequence which is intended to be read, the data must be decoded during the read process to recover the original data bit stream. Some data encoding/decoding systems known in the prior art include partial response, maximum likelihood (PRML); extended PRML (EPRML); enhanced, extended PRML (EEPRML); fixed delay tree search (FDTS); and decision feedback equalization (DFE).

Several of these systems require maximum likelihood detection for the data signal sampled during each clock cycle. This maximum likelihood detection is usually performed by a Viterbi detector. A Viterbi detector is a device which implements the Viterbi algorithm, named after Andrew Viterbi, who developed the algorithm in 1967. Viterbi detectors generally are well-known in the prior art.

In particular, the operating principles of an analog Viterbi detector for decoding rate-8/9 partial response type IV (PR4) signals are discussed in the prior art. See, e.g., Thomas W. Matthews and Richard R. Spencer, *An Integrated Analog CMOS Viterbi Detector for Digital Magnetic Recording*, 28 IEEE Journal of Solid-State Circuits 1294 (December 1993). For each sampled data bit, this detector must calculate or measure a quantity known as a "metric." The Viterbi algorithm is applied to a series of such calculated metrics to produce a decoded data bit stream.

Calculation of the metric for an input signal sampled during one clock cycle requires a comparison of the input signal $V_{IN}$ with a high reference voltage $V_{REF+}$, a low reference voltage $V_{REF-}$, and the metric from the previous clock cycle. More specifically, the output metric $V_M$ for clock cycle n should be determined according to the following rules:

If $(V_{IN}-V_{REF+})>V_{M(n-1)}$ then $V_{M(n)}=(V_{IN}-V_{REF+})$     (1)

If $(V_{IN}-V_{REF-})<V_{M(n-1)}$ then $V_{M(n)}=(V_{IN}-V_{REF-})$     (2)

If $(V_{IN}-V_{REF-})>V_{M(n-1)}>(V_{IN}-V_{REF+})$ then $V_{M(n)}=V_{M(n-1)}$     (3)

A method and circuit for reliably and accurately implementing these rules to calculate a metric in a Viterbi detector is needed.

A prior art circuit utilized a sample-and-hold circuit to sample the voltage on an output node every clock cycle. Under the conditions of rules (1) and (2), one of which occurs whenever a one is read from the disk, the output from an appropriate summing amplifier would be switched to the input of the sample-and-hold circuit during the sample mode. At the sample-to-hold mode transition, the sample-and-hold circuit input would be transferred to the sample-and-hold circuit output node.

Under the condition of rule (3), which occurs when a zero is read from the disk, all switches between the summing amplifiers and the sample-and-hold circuit would be left open. The sample-and-hold circuit would resample and transfer to its output node the same input voltage every clock cycle. The voltage on the output node would thus remain substantially unchanged from the previous clock cycle, as required by rule (3).

Unfortunately, the act of sampling the input voltage alters that voltage slightly due to gain error and clock feedthrough in the sample-and-hold circuit. Moreover, if zeros are encountered for several consecutive clock cycles, the deviations in the sample-and-hold output voltage are compounded by sampling the input voltage every clock cycle. This introduces error into the calculation of the metric, which in turn renders the results of the Viterbi algorithm calculations inaccurate. As a result, errors may be introduced into the data decoding process. Therefore, a method and circuit for more accurately implementing rules (1)–(3) to calculate a metric in a Viterbi detector are needed.

SUMMARY OF THE INVENTION

A method for calculating an updated metric for an analog Viterbi detector is disclosed. Those steps are (1) subtracting a first reference voltage from a data signal to produce a first difference voltage; (2) subtracting a second reference voltage from the data signal to produce a second difference voltage; (3) comparing the first difference voltage with a previous metric signal to produce a first comparator output voltage; (4) comparing the second difference voltage with the previous metric signal to produce a second comparator output voltage; (5) combining the first comparator output voltage with a first clock voltage in an AND operation to produce a first logic signal; (6) combining the second comparator output voltage with the first clock voltage in an AND operation to produce a second logic signal; (7) sampling the first difference voltage when the first logic signal is high to produce an updated metric voltage; (8) sampling the second difference voltage when the second logic signal is high to produce the updated metric voltage; and (9) retaining the previous metric voltage as the updated metric voltage when both the first and second logic output signals are low.

A circuit for calculating an updated metric voltage for an analog Viterbi detector in accordance with the invention comprises (1) a first summing amplifier for subtracting a first reference voltage from a data signal; (2) a second summing amplifier for subtracting a second reference voltage from the data signal; (3) a first comparator for comparing the output of the first summing amplifier with a previous metric signal; (4) a second comparator for comparing the output of the second summing amplifier with the previous metric signal; (5) a first AND gate for ANDing the output of the first comparator and a first clock signal; (6) a second AND gate for ANDing the output of the second comparator and the first clock signal; (7) a first sample-and-hold device for sampling the output of the first summing amplifier when the output of the first AND gate is high; (8) a second sample-and-hold device for sampling the output of the second summing amplifier when the output of the second AND gate is high; and (9) a holding capacitor for retaining the previous metric signal as the updated metric signal when the outputs of both AND gates are low.

A technical advantage of the present invention is that a method for calculating metrics for an analog Viterbi detector is provided. Another technical advantage is that the invention reduces sampling errors introduced into the updated metric signal. Another technical advantage is that a relatively simple and inexpensive circuit design is used to produce the updated metric signal.

BRIEF DESCRIPTION OF THE DRAWINGS

For a more complete understanding of the present invention, the objects and advantages thereof, reference is now made to the following descriptions taken in connection with the accompanying drawings in which:

FIG. 3 is a timing diagram for the metric calculator circuit.

FIG. 4 is a diagram of an alternative embodiment of a metric calculator circuit in accordance with the invention using differential voltages.

DETAILED DESCRIPTION OF THE INVENTION

The preferred embodiment of the present invention and its advantages are best understood by referring to FIGS. 1 through 4 of the drawings, like numerals being used for like and corresponding parts of the various drawings.

Figure 1:
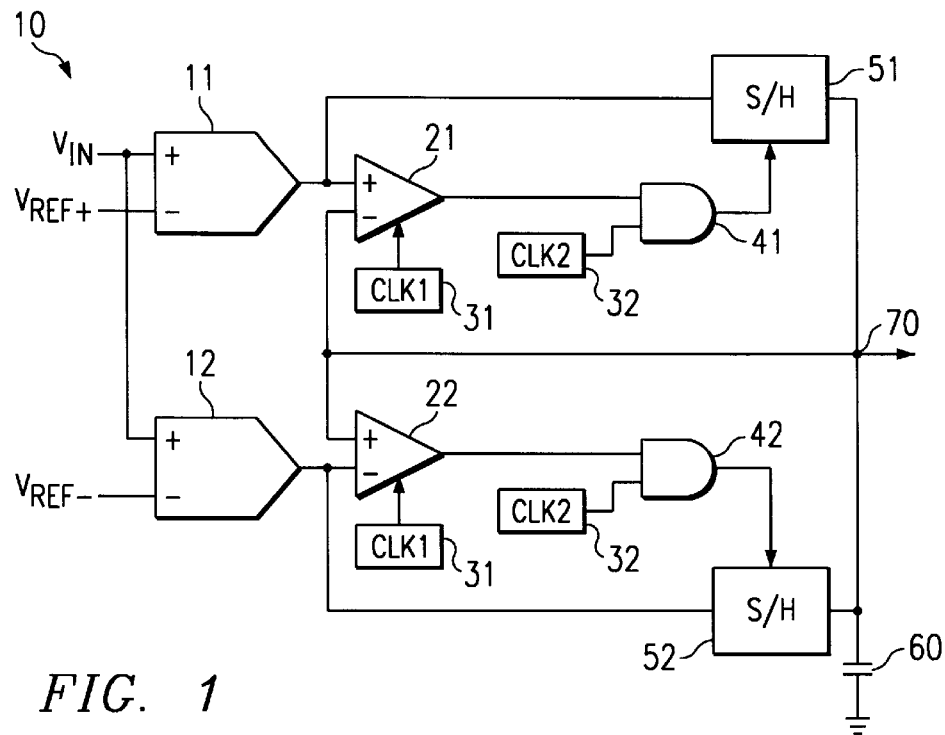
FIG. 1 is a diagram of a metric calculator circuit in accordance with the invention.

In FIG. 1, a metric calculator circuit 10 according to the present invention is shown. The purpose of this circuit is to receive an input data signal $V_{IN}$ and input reference voltages $V_{REF+}$ and $V_{REF-}$, and to produce an accurate output metric signal $V_{M(n)}$ on output node 70 in accordance with the following rules:

If $(V_{IN}-V_{REF+})>V_{M(n-1)}$ then $V_{M(n)}=(V_{IN}-V_{REF+})$ (1)

If $(V_{IN}-V_{REF-})<V_{M(n-1)}$ then $V_{M(n)}=(V_{IN}-V_{REF-})$ (2)

If $(V_{IN}-V_{REF-})>V_{M(n-1)}>(V_{IN}-V_{REF+})$ then $V_{M(n)}=V_{M(n-1)}$ (3)

The input data signal $V_{IN}$ is received by summing amplifiers 11 and 12. A high reference voltage $V_{REF+}$ is supplied to a negative input of summing amplifier 11. Likewise, a low reference voltage $V_{REF-}$ is supplied to a negative input of summing amplifier 12.

The output of summing amplifier 11, which is equal to $V_{IN}-V_{REF+}$, is supplied to a positive input of comparator 21.

The output of summing amplifier 12, which is equal to $V_{IN}-V_{REF-}$, is supplied to a negative input of comparator 22. The outputs of summing amplifiers 11 and 12 are also supplied to the inputs of sample-and-hold circuits 51 and 52, respectively.

Output node 70, which holds the previous metric signal voltage $V_{M(n-1)}$, is connected to a negative input of comparator 21 and a positive input of comparator 22. Comparators 21 and 22 are both triggered by a signal from clock 31. The outputs of comparators 21 and 22 are supplied to the inputs of AND gates 41 and 42, respectively. Clock 32 supplies a second input for each AND gate 41 and 42.

The outputs of AND gates 41 and 42 are supplied to the trigger inputs of sample-and-hold circuits 51 and 52, respectively. The outputs of sample-and-hold circuits 51 and 52 are supplied to the output node 70. Holding capacitor 60 is connected between the output node 70 and a ground potential.

The input data signal $V_{IN}$ may be read directly from a read/write head of a hard disk drive (not shown). More typically, however, some equalization of the input data signal $V_{IN}$ will take place before its use in the metric calculator circuit 10. In the preferred embodiment, $V_{IN}$ is a sample-and-hold output of a finite impulse response (FIR) filter (not shown).

Figure 2:
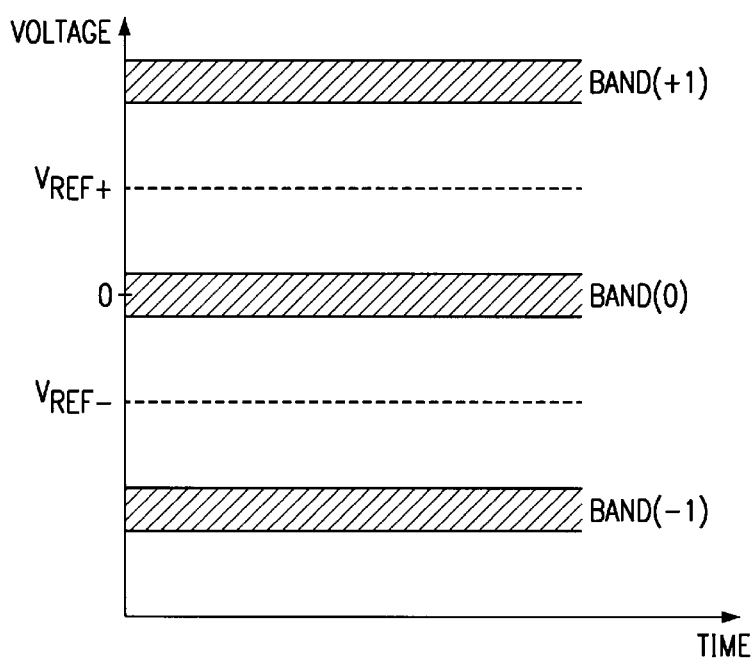
FIG. 2 is an illustration of the input voltage signals received by the metric calculator circuit.

As a result of the equalization performed by the FIR filter, input data signal $V_{IN}$ will occupy one of the three voltage bands shown in FIG. 2. The first of these voltage bands, BAND(+1), is higher than reference voltage $V_{REF+}$. The second of these voltage bands, BAND(0), is between $V_{REF+}$ and $V_{REF-}$ and is near ground potential. The third of these voltage bands, BAND(−1), is below voltage $V_{REF-}$. Reference voltages $V_{REF+}$ and $V_{REF-}$ have opposite polarity with respect to ground, and may have equal magnitude.

As a result of the operation of summing amplifier 11, the high reference voltage $V_{REF+}$ is subtracted from the input voltage $V_{IN}$. The difference voltage, which is the output of summing amplifier 11, is supplied to the positive input of comparator 21, while the previous metric signal is supplied to the negative input of comparator 21 from output node 70. As a result of this comparison, if $V_{IN}-V_{REF+}$ is greater than the previous metric signal $V_{M(n-1)}$, then the output of comparator 21 is high when triggered by the signal from clock 31. If $V_{IN}-V_{REF+}$ is less than the previous metric signal $V_{M(n-1)}$ when comparator 21 is triggered by the signal from clock 31, then the output of comparator 21 is low.

The output of comparator 21 is combined in a logical AND operation with the signal from clock 32, which may be identical to the signal from clock 31. The result of this logical AND operation, which takes place in AND gate 41, is that the output of AND gate 41 is high when $V_{IN}-V_{REF+}$ is greater than $V_{M(n-1)}$ and the signal from clock 32 is high. When this condition occurs, the sample-and-hold circuit 51 is triggered to sample the difference voltage $V_{IN}-V_{REF+}$ from the output of summing amplifier 11. This sampled difference voltage then becomes the new metric signal voltage $V_{M(n)}$ on output node 70.

In a similar manner, the low reference voltage $V_{REF-}$ is subtracted from the input data signal voltage $V_{IN}$ in summing amplifier 12. The output of summing amplifier 12 is supplied to the negative input of comparator 22, while the positive input of comparator 22 receives the previous metric signal voltage $V_{M(n-1)}$ from output node 70. As a result, the output of comparator 22 is high when $V_{IN}-V_{REF-}$ is less than $V_{M(n-1)}$. When this condition occurs simultaneously with the signal from clock 32 being high, the output of AND gate 42 is high, triggering sample-and-hold circuit 52 to sample the difference voltage $V_{IN}-V_{REF-}$. This difference voltage then becomes the new metric signal voltage $V_{M(n)}$ on output node 70.

During periods when sample-and-hold circuits 51 and 52 are not triggered to supply an output voltage to output node 70, the node is maintained at the previous metric signal voltage $V_{M(n-1)}$ due to the charge maintained on holding capacitor 60. This occurs whenever the signal from clock 32 is low, or during sampling periods when rule (3) is in effect.

It can be seen by reference to FIG. 2 in light of the previous discussion that when the input data signal voltage $V_{IN}$ is in the upper voltage band above $V_{REF+}$, sample-and-hold circuit 51 might be triggered while sample-and-hold circuit 52 cannot be triggered. Conversely, when the input data signal voltage $V_{IN}$ is less than the lower reference voltage $V_{REF-}$, then sample-and-hold circuit 52 might be triggered while sample-and-hold circuit 51 cannot be triggered. When $V_{IN}$ is near ground potential in the middle band between $V_{REF+}$ and $V_{REF-}$, neither sample-and-hold circuit 51 nor 52 can be triggered.

From the above description, it can be seen that the metric calculator circuit 10 will implement the rules (1)–(3) in producing an output metric signal $V_{M(n)}$ on output node 70. Moreover, because the signal from clock 32 is ANDed with the outputs of comparators 21 and 22, sample-and-hold devices 51 and 52 are only triggered under the conditions of rules (1) and (2). Thus, sampling only occurs during clock cycles in which a new metric signal voltage is produced.

A timing diagram illustrating the operation of circuit 10 is shown in FIG. 3. Lines 1 and 2 shows the output signals of clocks 31 and 32, respectively. Line 3 shows the output of either AND gate 41 or 42 when its associated comparator output is high. This output is used to trigger sampling by sample-and-hold device 51 or 52, respectively. Line 4 shows the AND gate output when the associated comparator output is low. In this case, the associated sample-and-hold device 51 or 52 is not triggered.

By eliminating the triggering of the sample-and-hold circuits during clock cycles in which the previous metric signal voltage is to be retained in accordance with rule (3), circuit 10 will minimize errors introduced due to gain error and clock feedthrough in the sample-and-hold circuits. This advantage is gained with a relatively simple and inexpensive circuit design.

An alternative embodiment of the invention is shown in FIG. 4. In this embodiment, differential input voltages are used to produce a differential output metric signal voltage across nodes 170a and 170b in accordance with rules (1)–(3).

Differential metric calculator circuit 110 operates in a manner analogous to that of metric calculator circuit 10. In this embodiment, a high reference voltage $V_{REF+}$ is supplied across the input ports 111c and 111d of summing circuit 111. Likewise, a low reference voltage $V_{REF-}$, which is opposite in polarity to $V_{REF+}$, is supplied across input ports 112c and 112d of summing circuit 112. The input data signal voltage $V_{IN}$ is supplied across ports 111a and 111b of summing circuit 111 and across ports 112a and 112b of summing circuit 112.

The output signal of summing circuit 111 is supplied across input terminals 121a and 121b of comparator 121. The output signal of summing circuit 112 is supplied across input terminals 122c and 122d of comparator 122.

The output signal of summing amplifier 111 is also supplied to sample-and-hold circuit 151, which comprises sample-and-hold devices 151a and 151b. Likewise, the output signal of summing circuit 112 is supplied to sample-and-hold circuit 152, which comprises sample-and-hold devices 152a and 152b.

The previous metric signal voltage $V_{m(n-1)}$ is supplied across input ports 121c and 121d of comparator 121, as well as input ports 122a and 122b of comparator 122. Here, $$V_{m(n-1)}=V_{m+(n-1)}-V_{m-(n-1)}$$

Comparators 121 and 122 are triggered by a signal from clock 131. The output signals from comparators 121 and 122 are supplied to inputs of AND gates 141 and 142, respectively. A signal from clock 132 is also supplied to inputs of AND gates 141 and 142.

The output signals from AND gates 141 and 142 are used to trigger sample-and-hold circuits 151 and 152, respectively. The outputs of sample-and-hold circuits 151 and 152 are supplied across the metric signal output nodes 170a and 170b. Holding capacitors 160a and 160b are connected between nodes 170a and 170b, respectively, and a ground potential.

The operation of this circuit is as follows. $V_{REF+}$ is subtracted from $V_{IN}$ in summing circuit 111 and the difference is supplied to comparator 121. If this difference voltage is greater than the previous metric signal voltage $V_{m(n-1)}$, then the output of comparator 121 is high when triggered by the signal from clock 131.

The signals from clocks 131 and 132 may be identical and are both high during a metric signal update period in which rules (1)–(3) are to be implemented. During such a period, if the output from comparator 121 is high, then the output from AND gate 141 will likewise be high, triggering sample-and-hold circuit 151 to sample the output from summing circuit 111. This output, which is equal to $V_{IN}-V_{REF+}$, will then be supplied across output nodes 170a and 170b.

Summing circuit 112 subtracts $V_{REF-}$ from $V_{IN}$, and this difference voltage is supplied to an input of comparator 122. During a metric signal update period, when the signal from clock 131 is high, if $V_{IN}-V_{REF-}$ is less than the previous metric signal voltage $V_{m(n-1)}$, then the output from comparator 122 will be high, as will the output from AND gate 142. This will trigger sample-and-hold circuit 152 to sample the output voltage from summing circuit 112. This output voltage, which is equal to $V_{IN}-V_{REF-}$, will thus be supplied across output nodes 170a and 170b.

When the signal from clock 132 is low, the voltage across output nodes 170a and 170b will be maintained by holding capacitors 160a and 160b. The same is true when rule (3) is in effect during a metric signal update period.

As the above explanation makes clear, the circuit 110, like circuit 10, will accurately implement rules (1)–(3) in producing an output metric signal $V_{m(n)}$. The same advantages described with respect to circuit 10, most importantly the elimination of sample-and-hold circuit triggering while rule (3) is in effect, will be derived from the design of circuit 110.

While the invention has been particularly shown and described by the foregoing detailed description, it will be understood by those skilled in the art that various other changes in form and detail may be made without departing from the spirit and scope of the invention.

What is claimed is:

1. A circuit for generating an updated metric signal, comprising:

a first logic gate for receiving a first comparator output signal and a clock signal, and for generating a first logic output signal;

a second logic gate for receiving a second comparator output signal and the clock signal, and for generating a second logic output signal;

a first sample-and-hold device for sampling a first sum output signal in response to the first logic output signal;

a second sample-and-hold device for sampling a second sum output signal in response to the second logic output signal;

a first comparator for comparing the first sum output signal with a previous metric signal, and for generating the first comparator output signal; and a second comparator for comparing the second sum output signal with the previous metric signal, and for generating the second comparator output signal.

2. A circuit for generating an updated metric signal, comprising:

a first logic gate for receiving a first comparator output signal and a clock signal, and for generating a first logic output signal;

a second logic gate for receiving a second comparator output signal and the clock signal, and for generating a second logic output signal;

a first sample-and-hold device for sampling a first sum output signal in response to the first logic output signal;

a second sample-and-hold device for sampling a second sum output signal in response to the second logic output signal;

a first analog adder for receiving a first reference signal and a data signal, and for generating the first sum output signal; and a second analog adder for receiving a second reference signal and the data signal, and for generating the second sum output signal.

3. A circuit for generating an updated metric signal, comprising:

a first logic gate for receiving a first comparator output signal and a clock signal, and for generating a first logic output signal;

a second logic gate for receiving a second comparator output signal and the clock signal, and for generating a second logic output signal;

a first sample-and-hold device for sampling a first sum output signal in response to the first logic output signal;

a second sample-and-hold device for sampling a second sum output signal in response to the second logic output signal; and a holding capacitor having first and second charge plates, the first charge plate being electrically connected to an output node of the first sample-and-hold device and an output node of the second sample-and-hold device, the second charge plate being electrically connected to a ground node.

4. A circuit for generating an updated metric signal, comprising:

a first logic gate for receiving a first comparator output signal and a clock signal, and for generating a first logic output signal;

a second logic gate for receiving a second comparator output signal and the clock signal, and for generating a second logic output signal;

a first sample-and-hold device for sampling a first sum output signal in response to the first logic output signal;

a second sample-and-hold device for sampling a second sum output signal in response to the second logic output signal; and first and second holding capacitors, each holding capacitor having first and second charge plates, the first charge plate of the first holding capacitor being electrically connected to a first output node of the first sample-and-hold device and a first output node of the second sample-and-hold device, the first charge plate of the second holding capacitor being electrically connected to a second output node of the first sample-and-hold device and a second output node of the second sample-and-hold device, the second charge plates of the first and second holding capacitors being electrically connected to ground nodes.

5. A Viterbi detector having a metric calculator, the metric calculator comprising:

a first logic gate for performing a first Boolean logic operation on a first comparator output signal and a clock signal, and for generating a first logic output signal;

a second logic gate for performing a second Boolean logic operation on a second comparator output signal and the clock signal, and for generating a second logic output signal;

a first sampling device for sampling and retaining a first sum output signal in response to the first logic output signal;

a second sampling device for sampling and retaining a second sum output signal in response to the second logic output signal;

a first comparator for comparing the first sum output signal with a previous metric signal, and for generating the first comparator output signal as a result of the comparison; and a second comparator for comparing the second sum output signal with the previous metric signal, and for generating the second comparator output signal as a result of the comparison.

6. A Viterbi detector having a metric calculator, the metric calculator comprising:

a first logic gate for performing a first Boolean logic operation on a first comparator output signal and a clock signal, and for generating a first logic output signal;

a second logic gate for performing a second Boolean logic operation on a second comparator output signal and the clock signal, and for generating a second logic output signal;

a first sampling device for sampling and retaining a first sum output signal in response to the first logic output signal;

a second sampling device for sampling and retaining a second sum output signal in response to the second logic output signal;

a first adding device for additively combining a first reference signal and a data signal, and for generating the first sum output signal; and a second adding device for additively combining a second reference signal and the data signal, and for generating the second sum output signal.

7. A Viterbi detector having a metric calculator, the metric calculator comprising:

a first logic gate for performing a first Boolean logic operation on a first comparator output signal and a clock signal, and for generating a first logic output signal;

a second logic gate for performing a second Boolean logic operation on a second comparator output signal and the clock signal, and for generating a second logic output signal;

a first sampling device for sampling and retaining a first sum output signal in response to the first logic output signal; and a second sampling device for sampling and retaining a second sum output signal in response to the second logic output signal, wherein the metric calculator further comprises a charge storage device for storing an electrical charge associated with a retained one of the first and second sum output signals.

8. A method for generating an updated metric signal for an analog Viterbi detector utilizing a previous metric signal, comprising the steps of:

generating first and second sum output signals;

generating a clock signal;

receiving at a first comparator the first sum output signal and the previous metric signal, and generating a first comparator output signal;

receiving at a second comparator the second sum output signal and the previous metric signal, and generating a second comparator output signal;

receiving at a first logic gate the clock signal and the first comparator output signal, and generating a first logic output signal;

receiving at a second logic gate the clock signal and the second comparator output signal, and generating a second logic output signal;

generating an updated metric signal, in response to the first and second logic output signals, which is equal to:
(1) the first sum output signal if the first logic output signal is high;
(2) the second sum output signal if the second logic output signal is high; and
(3) the previous metric signal if the first and second logic output signals are low.

9. The method of claim 8, wherein the steps of generating the first and second comparator output signals include the steps of:

determining a polarity of the potential difference between the first sum output signal and the previous metric signal;

generating a high or low signal as the first comparator output signal in response to the polarity of the potential difference between the first sum output signal and the previous metric signal;

determining a polarity of the potential difference between the second sum output signal and the previous metric signal; and generating a high or low signal as the second comparator output signal in response to the polarity of the potential difference between the second sum output signal and the previous metric signal.

10. The method of claim 8, further including the steps of:

generating an equalized data signal;

generating first and second reference signals;

wherein the step of generating the first and second sum output signals includes the steps of:
generating the first sum output signal in response to a difference between the first reference signal and the equalized data signal; and
generating the second sum output signal in response to a difference between the second reference signal and the equalized data signal.

11. The method of claim 8, further comprising the step of storing an electric charge associated with the updated metric signal on a holding capacitor.

12. The method of claim 10, wherein the step of generating the equalized data signal includes filtering an unequalized data signal with a finite impulse response filter.

13. The method of claim 8, wherein the step of generating the updated metric signal includes the steps of:

sampling and retaining the first sum output signal in response to the first logic output signal;

sampling and retaining the second sum output signal in response to the second logic output signal; and retaining the previous metric signal in response to the first and second logic output signals.

14. The method of claim 8, wherein the steps of generating the first and second comparator output signals are each performed in response to the clock signal.

* * * * *

UNITED STATES PATENT AND TRADEMARK OFFICE
CERTIFICATE OF CORRECTION

PATENT NO : 5,933,463
DATED : Aug. 3, 1999
INVENTOR(S): Davy H. Choi

It is certified that error appears in the above-identified patent and that said Letters Patent are hereby corrected as shown below:

On the face of this patent, please insert the following after "Related U.S. Application Data":

Provisional application No. 60/009,175 Dec. 22, 1995.

Signed and Sealed this

Third Day of April, 2001

*Attest:*

NICHOLAS P. GODICI

*Attesting Officer*     *Acting Director of the United States Patent and Trademark Office*